United States Patent [19]

Kushin et al.

[11] 4,083,042
[45] Apr. 4, 1978

[54] CONTINUOUS QUANTITATIVE SIGNAL-DISPLAY SYSTEM USING LIGHT-EMITTING ELEMENTS

[75] Inventors: George Raymond Kushin, Plantation; Ming-Luh Kao, Miami, both of Fla.

[73] Assignee: Milgo Electronic Corporation, Miami, Fla.

[21] Appl. No.: 589,467

[22] Filed: Jun. 23, 1975

[51] Int. Cl.² .............................................. G06F 3/14
[52] U.S. Cl. ................................. 340/324 M; 178/18; 250/213 A
[58] Field of Search .............. 340/324 R, 324 M, 336, 340/166 EL, 168 S; 178/18; 250/213 A

[56] References Cited

U.S. PATENT DOCUMENTS

| B 351,493 | 1/1975 | Ingle | 340/336 |
| 3,761,620 | 9/1973 | Graven | 178/18 |
| 3,866,171 | 2/1975 | Loshbough | 340/336 |

*Primary Examiner*—Marshall M. Curtis
*Attorney, Agent, or Firm*—Jackson & Jones Law Corporation

[57] ABSTRACT

A thermometer or bouncing-ball LED display system provides a fast response, easily readable, quantitative indication of a variable. A received analog signal, representing the variable to be displayed, is effectively compared with an analog signal representing the present display indication. The difference therebetween is averaged over a sampling period. If this average difference exceeds a predetermined limit in either a positive or negative direction, the display indication is changed to reflect this difference. The sensitivity of the display can be selectively determined by increasing or decreasing the sampling frequency and the predetermined limit. The display system can be selectively operated in three different response modes. In a fast-attack, slow-release mode, the display indication is changed more rapidly in response to positive direction differences in the compare stage, than in response to negative direction differences. In a fast mode, the display indication is changed rapidly in response to either positive or negative direction differences in the compare stage. In a slow mode, the display indication is changed less rapidly in response to either positive or negative differences in the compare stage.

26 Claims, 13 Drawing Figures

| COUNT | Q4 | Q3 | Q2 | Q1 | DISPLAY UPDATE |
|---|---|---|---|---|---|
| 15 | 1 | 1 | 1 | 1 | SHIFT UP |
| 14 | 1 | 1 | 1 | 0 | |
| 13 | 1 | 1 | 0 | 1 | |
| 12 | 1 | 1 | 0 | 0 | SHIFT UP |
| 11 | 1 | 0 | 1 | 1 | NO SHIFT |
| 10 | 1 | 0 | 1 | 0 | |
| 9 | 1 | 0 | 0 | 1 | |
| 8 | 1 | 0 | 0 | 0 | RESET |
| 7 | 0 | 1 | 1 | 1 | |
| 6 | 0 | 1 | 1 | 0 | |
| 5 | 0 | 1 | 0 | 1 | |
| 4 | 0 | 1 | 0 | 0 | NO SHIFT |
| 3 | 0 | 0 | 1 | 1 | SHIFT DOWN |
| 2 | 0 | 0 | 1 | 0 | |
| 1 | 0 | 0 | 0 | 1 | |
| 0 | 0 | 0 | 0 | 0 | SHIFT DOWN |
FIG. 4
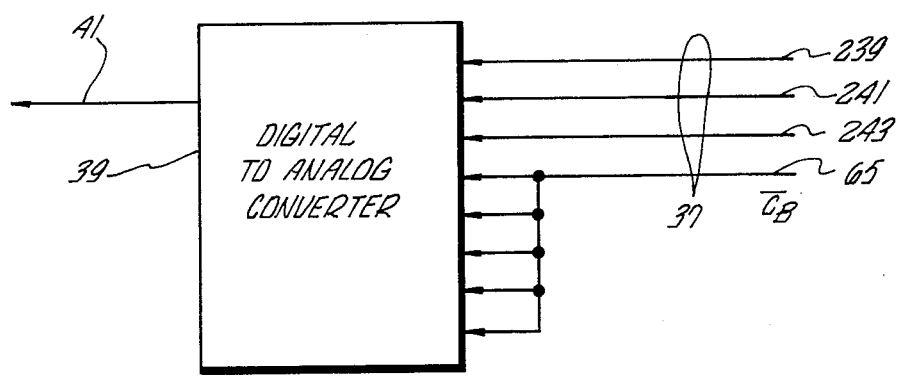
FIG. 10
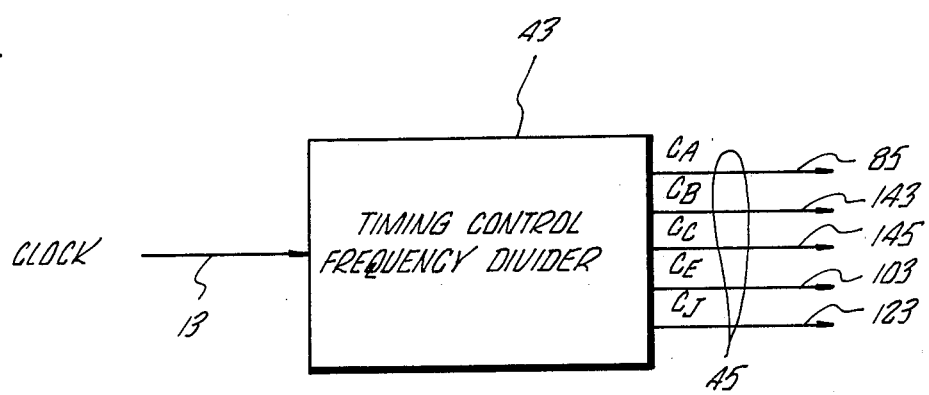
FIG. 11

| MAGNITUDE LEVEL | INDICATION DECODE | | | LEAST SIGNIFICANT BITS (LSB's) | | | | | $\overline{CB}$ CLOCK STATE | DECIMAL EQ. REFERENCE VALUES |
|---|---|---|---|---|---|---|---|---|---|---|
| | 1ST MSB | 2ND MSB | 3RD MSB | | | | | | | |
| LQ60N | 1 | 1 | 1 | 1 | 1 | 1 | 1 | 1 | ONE | 255 |
| | 1 | 1 | 1 | 0 | 0 | 0 | 0 | 0 | ZERO | 224 |
| LQ50N | 1 | 1 | 0 | 1 | 1 | 1 | 1 | 1 | ONE | 223 |
| | 1 | 1 | 0 | 0 | 0 | 0 | 0 | 0 | ZERO | 192 |
| LQ40N | 1 | 0 | 1 | 1 | 1 | 1 | 1 | 1 | ONE | 191 |
| | 1 | 0 | 1 | 0 | 0 | 0 | 0 | 0 | ZERO | 160 |
| LQ30N | 1 | 0 | 0 | 1 | 1 | 1 | 1 | 1 | ONE | 159 |
| | 1 | 0 | 0 | 0 | 0 | 0 | 0 | 0 | ZERO | 128 |
| LQ20N | 0 | 1 | 1 | 1 | 1 | 1 | 1 | 1 | ONE | 127 |
| | 0 | 1 | 1 | 0 | 0 | 0 | 0 | 0 | ZERO | 96 |

FIG. 9

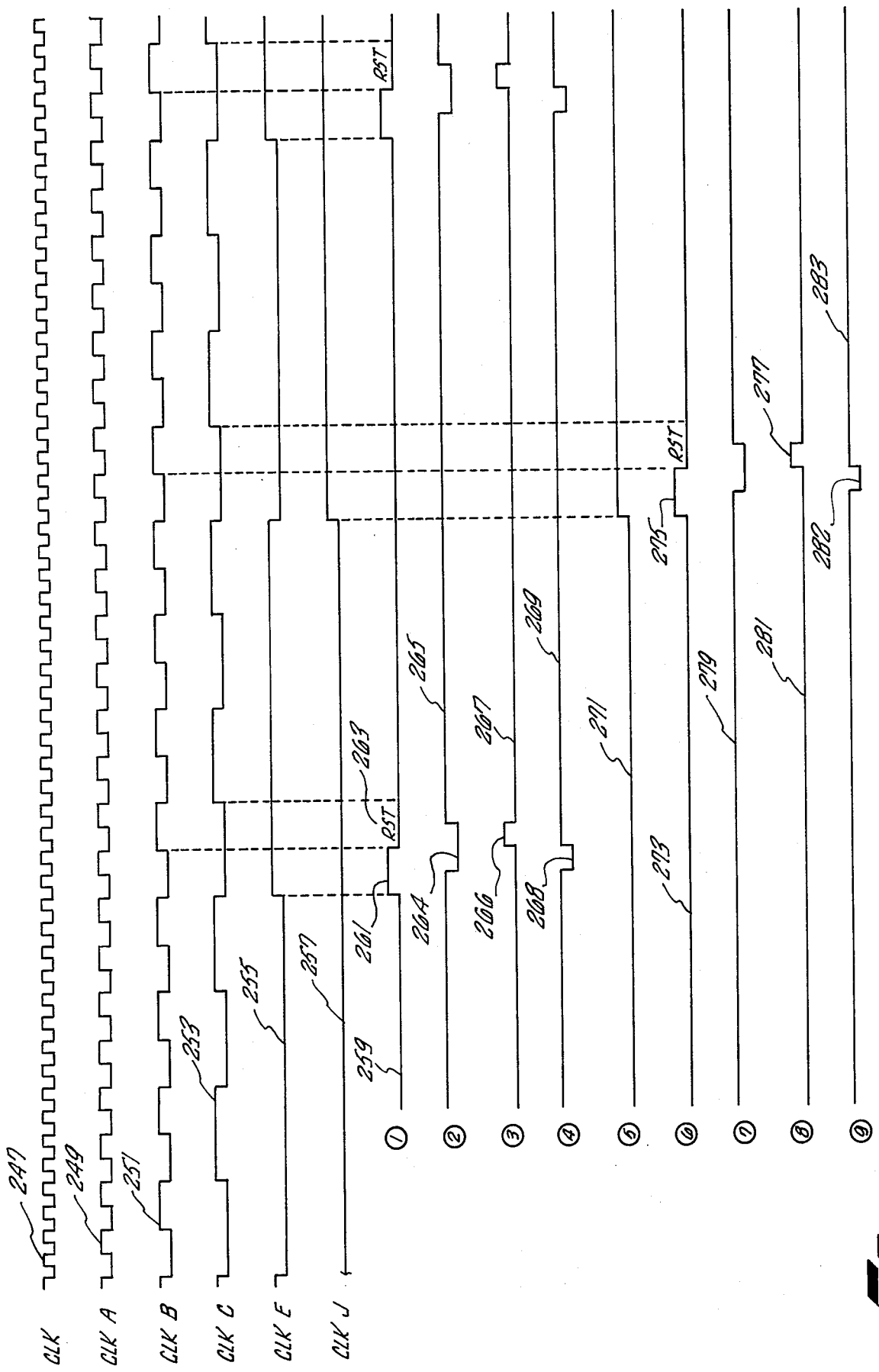

CONTINUOUS QUANTITATIVE SIGNAL-DISPLAY SYSTEM USING LIGHT-EMITTING ELEMENTS

BACKGROUND OF THE INVENTION

The present invention relates to display systems and more particularly pertains to light display systems wherein a quantitative visual induction of the measured variable of a function is presented.

Present methods for the electronic measurement of function variables include well-known spring-loaded pointer devices used for example, in analog volt meters. Spring-loaded devices have the inherent characteristic of being a relatively slow-response instrument and requiring close observation for accurate readings, due to their electromagnetic and mechanical lag. Another prior art device used for electronic measurement is the digital volt meter. Here ambiguity in deciphering the rapidly changing digits and electronic lag is present.

It is also known to utilize light displays consisting of one to three discrete lights to indicate a certain condition about the variable being measured. Such light displays do not provide a quantitative indication to the observer. However, these light displays have the advantage of being able to provide instantaneous indications, and allow the observer to monitor the indication from a relatively long distance away. These prior art light displays are quite satisfactory in situations where a quantitative judgment is not required.

OBJECTS AND SUMMARY OF THE INVENTION

An object of this invention is to provide a signal display system having a fast response time, long range readability and quantitative indications.

Another object of this invention is to provide a signal display system that operates mostly in the binary signal domain, thereby facilitating the use of solid state binary components.

Yet another object of this invention is to provide a signal display system that operates mostly in the binary domain and may be adjusted for varying degrees of sensitivity.

Still another object of this invention is to provide a signal display system that operates mostly in the binary domain and may be operated in three different response modes.

A still further object of this invention is to provide a signal display system that can selectively provide either a "bouncing ball" type or "thermometer" type indication.

These objects and the general purpose of this invention are accomplished in the following manner. An analog signal, representing a variable to be displayed, is compared in magnitude with an analog signal representing the present indication of the display. The difference therebetween is averaged over a number of compares. If this average value exceeds a predetermined maximum, or is less than a predetermined minimum during a certain sample time interval, the display indication is changed to correspond thereto. The average value resulting from the compares is sampled at selectively variable rates. This value causes the display driving logic to increase or decrease the LED display indication. A switch is utilized to convert the display indication from a "bouncing ball" type to a "thermometer" type, or vice versa. The display indication is decoded into a binary number that is converted into an analog voltage level. This voltage level is compared with the incoming signal to be displayed. If non-linear scaling of the display indication is desired, the binary output of the display driving logic may be used to address a ROM, the output of the ROM being utilized to drive the display decode and threshold generator.

BRIEF DESCRIPTION OF THE DRAWINGS

Other objects and advantages of the invention will hereinafter become more fully apparent from the following description of the annexed drawings which illustrate a preferred embodiment and in which like reference numerals designate like parts throughout the figures thereof and wherein:

FIG. 4 is a table indicating the states of the averaging apparatus of FIG. 3;

FIG. 9 is a table illustrating the possible output states of the display decode and threshold generator of FIG. 8;

FIG. 10 is a block diagram of the digital-to-analog converter of FIG. 1;

FIG. 11 is a block diagram of the timing control of FIG. 1;

FIG. 12 is a pulse diagram illustrating the signals from the timing control of FIG. 11 and at various points in the display update and mode selection circuit of FIG. 1;

DESCRIPTION OF THE PREFERRED EMBODIMENTS

For purposes of illustration, in the explanation of the present invention, it shall be assumed that the invention is being utilized to measure line signal quality in a data communication link. It should be understood, however, that the invention is by no means restricted to such application, or that it only has utility in such an environment.

Figure 1:
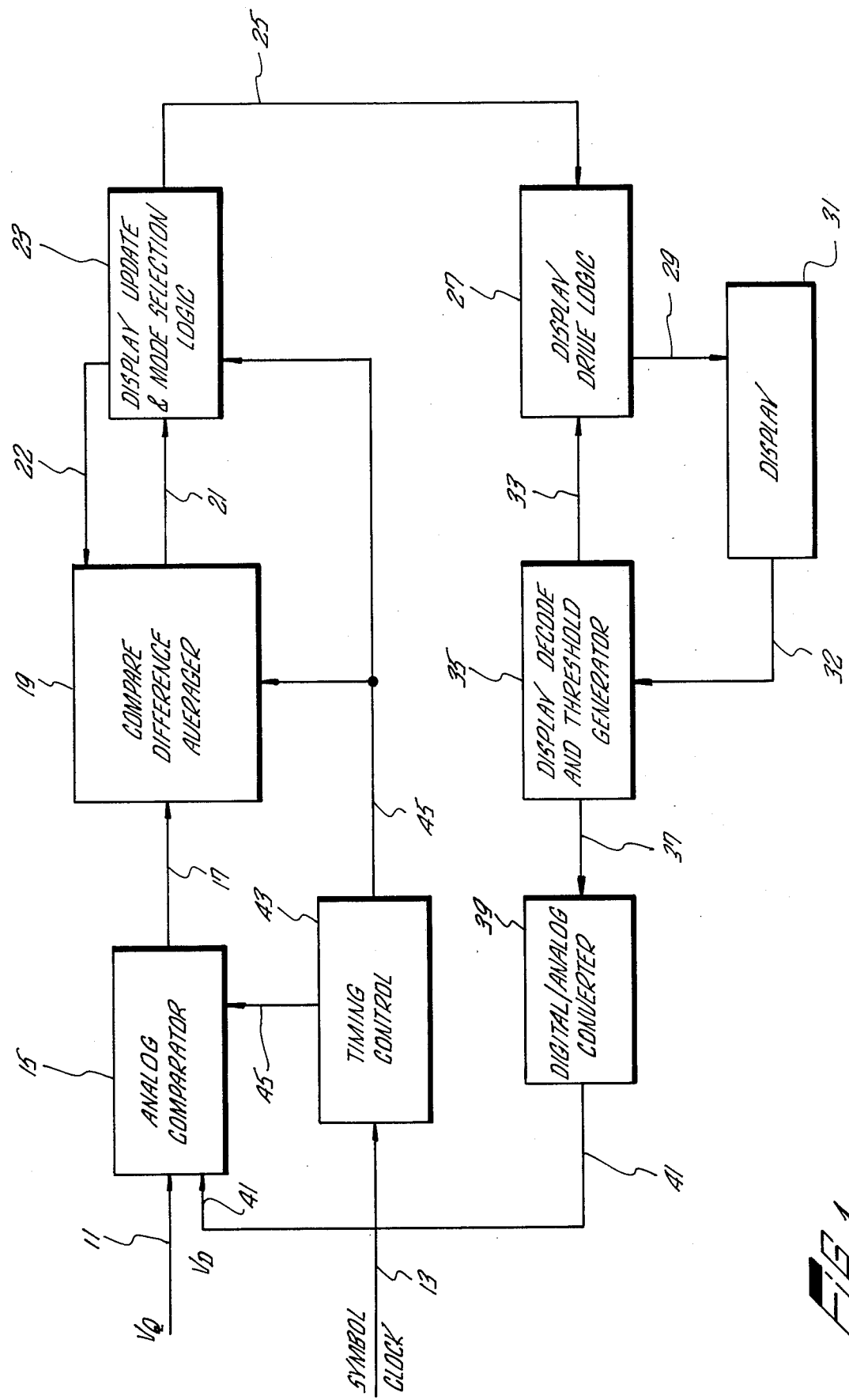
FIG. 1 is a block diagram of a signal display system according to the present invention.

Assuming that the signal display system of FIG. 1 is indicating the line signal a communication link, a signal indicating line signal quality would be received on line 11. Symbol clock pulses utilized for clocking the data through the communication link would be received on line 13. As a result of receiving these two signals, the display mechanism 31 has its indication updated in a positive or negative direction. The display mechanism 31 can be either driven by a plurality of binary levels supplied by display drive logic 27 over lines 29 or by analog signal levels actuated by the binary levels from display drive logic 27. These binary driving levels are monitored by a display decode and threshold generator 35 over lines 32. This decoder generates a multiple bit binary word in response to each unique combination of display element being driven in display mechanism 31. This binary word is supplied over lines 37 to a digital-to-analog converter 39. Each time the display is updated, the binary word on lines 37, supplied to the digital-to-analog converter, is also changed respectively.

Rather than generating a unique single word for each unique indication by the display mechanism 31, the display decode and threshold generator 35 generates a unique upper and lower threshold for that indication. In other words, two binary words are generated for each indication, one representing an upper limit and one representing a lower limit for that indication. The digital-to-analog converter 39 receives these binary words and appropriately converts them to analog voltage levels. These voltage levels are supplied over line 41 to one of the inputs of an analog comparator 15. The other input to the comparator is the signal on line 11, to be indicated. The analog comparator 15 performs an amplitude comparison, generating a binary one level on line 17, if the signal on line 11 is higher in amplitude than the signal on line 41, and a binary zero level if the signal on line 41 is higher in amplitude than the signal on line 11.

Thus, the signal on line 17 is either a binary one or binary zero, depending on the relative amplitudes of the signals on lines 11 and 41. These binary indications are supplied to a compare-difference averager 19 which is essentially a binary up/down counter that responds to binary ones by counting up and to binary zeros by counting down. The initial state, or reset condition, of the counter 19 is its mid-modulo count.

The output of the compare-difference averager 19 on line 21 is sampled according to a selected sampling rate. If the count within the compare-difference averager 19 is above a preset maximum threshold or below a preset minimum threshold, the display update and mode selection logic 23, at the sampling time, will cause the display drive logic 27 to generate new signals to the display mechanism 31. If the count within the compare-difference averager 19 is not above or below the preset maximum and minimum thresholds, then no update occurs. That is, the display update and mode selection logic 23 will not generate a signal on lines 35 directing the display drive logic 27 to change the display indication. The setting of this upper and lower limit within the compare-difference averager 19 contributes to defining the sensitivity of the display indication to the incoming signal on line 11.

The display update and mode selection logic 23 facilitates the operation of the display system in three distinct response modes. In a fast response mode, the display update logic 23 samples the count within the compare averager 19 in accordance with a certain periodic rate. In a slow-response mode the display update logic 23 samples the count within the compare averager 19 in accordance with a much slower sampling rate, updating the display indication accordingly. In a fast-attack, slow-release mode, the display update logic 23 samples the count within the compare averager 19 at the fast-mode rate but updates the display indication at the fast-mode rate if an increase is indicated and the slow-mode rate if a decrease is indicated. After each update operation, display update logic 23 resets the compare averager 19, by way of a signal on line 22, to its mid-modulo count.

Timing control logic 43 receives the symbol clock on line 13 and produces a plurality of clock frequencies for output lines 45, causing the operation of the various functional blocks above described to by synchronized. The display mechanism 31, as will be hereinafter more fully explained, possesses the facility of providing a "thermometer" type of indication, or a "bouncing ball" type of indication.

The timing control 43 is more specifically illustrated in FIG. 11, its various outputs being illustrated in FIG. 12. The timing control is basically a common frequency divider that receives a symbol clock on input line 13 and produces on lines 85, 143, 145, 103 and 123, in cable 45, five distinct, but related, clock frequencies, as illustrated in FIG. 12. The symbol clock is shown as pulse string 247 in FIG. 12. This symbol clock is divided to produce clock A pulse string 249 on line 85, clock B pulse string 251, clock C pulse string 253, clock E pulse string 255, and clock J pulse string 257.

Figure 2:
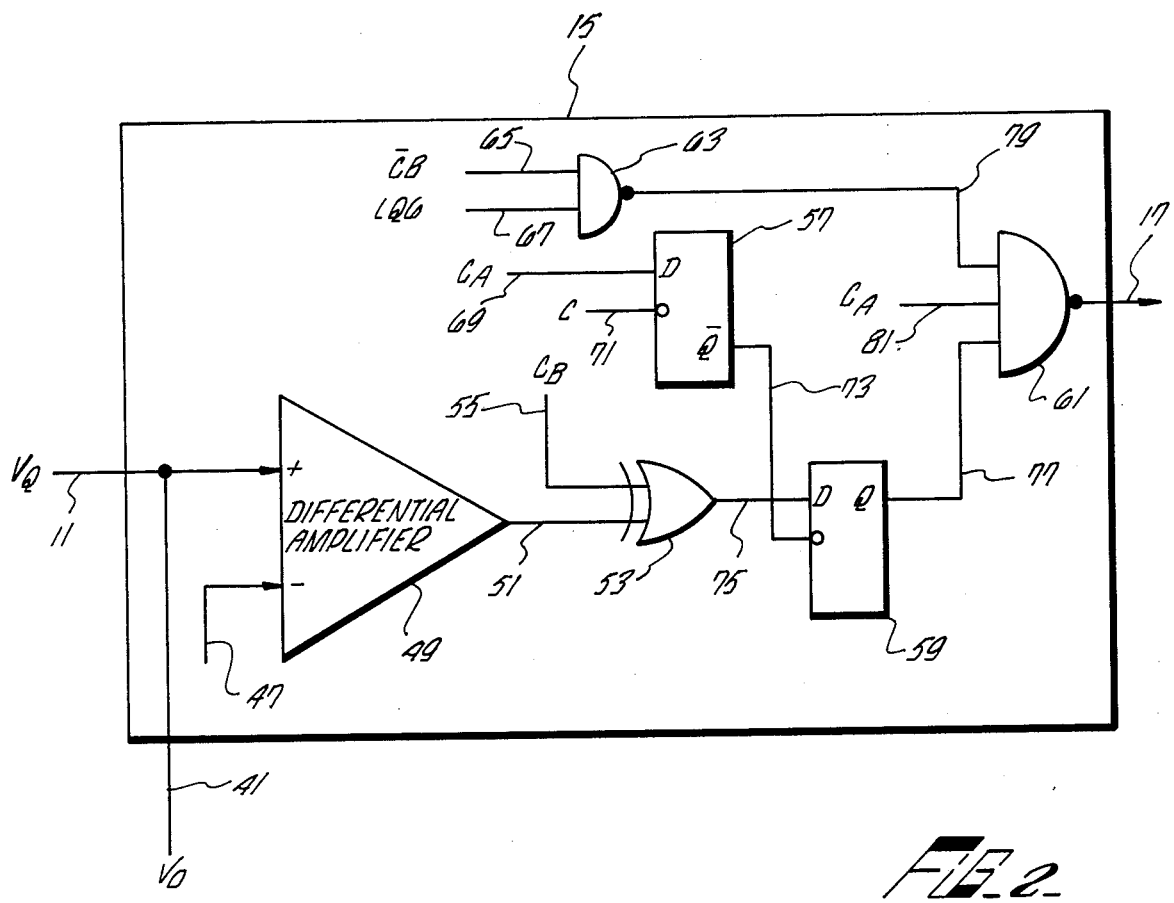
FIG. 2 is a logic diagram of the comparator circuit of FIG. 1.

Referring now to FIG. 2, the analog comparator 15 is shown as comprising a differential amplifier and a plurality of logic elements. The analog signal representing the display indication is supplied on line 41 to the plus input of the differential amplifier 49, along with the analog signal, on line 11, to be displayed. The negative input of the differential amplifier 49 is supplied by a negative voltage source 47 that causes the output, on line 51, of the differential amplifier 49 to be effectively a binary one level when the voltage amplitude of the signal on line 11 is greater than the voltage amplitude of the signal on line 41, and a binary zero level when the voltage amplitude of the signal on line 11 is less than the voltage amplitude of the signal on line 41.

The output of differential amplifier 49, on line 51, is supplied to an Exclusive OR gate 53 that samples the signal on line 51 according to a rate defined by $C_B$ clock train 251 (FIG. 12) on line 55. This clock rate is equal to ¼ the rate of the symbol clock received on line 13. If the binary signal level on line 51 is one, the output of Exclusive OR gate 53 on line 75 will be one, if the clock signal on line 55 is one and zero if the clock signal on line 55 is zero.

The signal at the D input of flip-flop 59 is supplied to its Q output on line 77 at the occurrence of a clock signal on line 73. The D-type flip-flop 57 provides this clock signal in response to the $C_A$ clock, received at its D input on line 69, and the symbol clock received at its clock input, on line 71. The signal generated on line 73 in response to these two clocks is a slightly delayed $C_A$ clock. This slight delay permits a short period of time for transient settling after each compare operation, before flip-flop 59 transfers the information.

The Q output of flip-flop 59, on line 77, is supplied to a three-input NAND gate 61. The outer two inputs to NAND gate 61 are the $C_A$ clock train 249 (FIG. 12), on line 81, and a display outflow signal, on line 79. The $C_A$ clock train 249 is equal to ½ the frequency of the symbol clock received on line 13. The display overflow signal on line 79 is generated by a two-input NAND gate 63 which receives a signal on line 67, which is a binary one when the last or next to the last light in the series array of the display mechanism is on, and inverse $C_B$ clock signal on line 65. Thus, whenever a binary one level is received on line 67 and the $C_B$ clock is at a binary zero, thereby producing a binary one on line 65, the output of NAND gate 63 is a binary zero, on line 79. This causes the output of NAND gate 61, on line 17 to be a binary one. As a result, the compare averager 19 is not incremented. If the signal on line 67 were a binary zero, NAND gate 63 would generate a binary one on line 79.

This causes the output of NAND gate 61, on line 17, to be a binary zero upon reception of clock signal $C_A$ on line 81 and the binary one signal on line 77 from D flip-flop 59. This binary zero on line 17 steps the binary counter 19.

Figure 3:
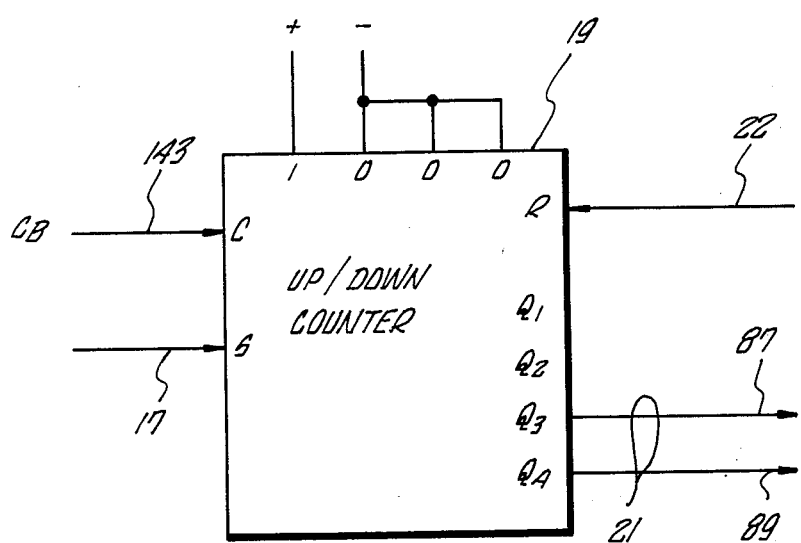
FIG. 3 is a block diagram of the averager apparatus of FIG. 1.

Referring now to FIG. 3, it can be seen that the up/down counter 19 is a standard, four-bit binary counter that counts from zero to 15 and resets to its mid-modulo count of eight, so that it may count either up or down. Whenever a binary zero level appears on line 17 at the input to the up/down counter 19, it is enabled to count either up or down depending upon the signal level on $C_B$ clock line 143. If the signal level on $C_B$ clock line 85 is one, the up/down counter 19 is enabled in the negative or down direction. If the binary signal level on $C_B$ clock line 85 is zero, the up/down counter 19 is enabled to count in the positive or up direction. It should be remembered, in connection with FIG. 2, that a binary one indication, generated by Exclusive OR gate 53 indicated an increase in the signal to be displayed over the present display indication, whenever the $C_B$ clock signal was a binary zero and the converse to be true when the $C_B$ clock signal was a binary one. The Q-3 and Q-4 outputs of the four-stage counter 19 is sampled by lines 87 and 89 of cable 21.

FIG. 4 illustrates all the states of the up/down counter 19. It can be seen that the Q-3 and Q-4 output signals are both binary one when the count of the up/down counter 19 is 12 or above and that they are both zero, when the count within the counter 19 is three or below. The area between these two limits, that is from 4 to 11, thereby defines a no-shift zone as will be hereinafter explained in connection with the display update and mode selection logic 23 of FIG. 5.

The signals from the up/down counter 19 on line 87 and 89 are supplied to the display update and mode selection logic 23, specifically to NAND gate 91 and an Exclusive OR gate 93. Additionally, the Q-4 output, on line 89, of up/down counter 19 is supplied to the display drive logic 27 of FIG. 6. The output of NAND gate 91 on line 101 is supplied to a D-type flip-flop 95. The signal on line 101 will be a binary zero, whenever both inputs to NAND gate 91 are a binary one. This condition will exist only when the count in the binary up/down counter 19 is 12 or higher. With binary one signal levels on lines 87 and 89, the Exclusive OR gate 93 will generate a binary zero, on line 96, that is interpreted as a binary one by AND gate 159. The binary one signal on line 89 is supplied to the display drive logic 27, as will be more fully explained hereinafter, to cause a shift left condition in that drive logic. Whenever the signals on line 87 and 89 are both binary zeros, the output of NAND gate 91 on line 101 is a binary one. The output of Exclusive OR gate 93, on line 96, will be a binary zero that is interpreted as a binary one level at the input of AND gate 159. The binary zero signal level on line 89 supplied to the display drive logic 27, will cause a shift right condition in that logic. Whenever alternate binary signal levels appear on line 87 and 89, the output of NAND gate 91 on line 101 will be a binary one and the output of Exclusive OR gate 93, on line 96, will be a binary one, which is interpreted as a binary zero at the input of AND gate 159.

Assuming first that the binary signal levels on both line 87 and line 89 are a binary one, indicating a count in the up/down counter 19 (FIG. 4) of 12 or higher, the binary signal at the D input of flip-flop 95 will be a binary zero causing the $\overline{Q}$ output, on line 117, to be a binary one at the occurrence of the next $C_E$ pulse train transition 255 on line 103. The $C_E$ pulse train is equal to a frequency 1/32 of the frequency of the received symbol clock.

For the present, it shall be assumed that the set and reset signal inputs of flip-flop 95 on lines 97 and 99, respectively, are both zero. As a consequence, the display update and mode selection logic 23 operates in the fast-attack, slow-release mode. In this mode, the $\overline{Q}$ output on line 117 causes the D flip-flop 113 to be reset, that is, rendering its Q output a binary zero. With the binary signal level on line 117 a binary one and the occurrence of the $C_E$ clock signal on line 103, AND gate 121 passes a binary one signal on line 129 to OR gate 131. Since flip-flop 113 is reset at this time, the Q output supplied to AND gate 125 causes the binary signal on line 127 to be zero. Therefore, the output of OR gate 131 on line 135 is a binary one level to the clock input of D-type flip-flop 137. At the occurrence of this binary one signal level on line 135, the one signal level on line 133, from a voltage source at input D of flip-flop 137 is clocked to the input of flip-flop 137 on line 151. This binary one is indicated as signal level 261 of signal 259 (FIG. 12). At the occurrence of a $C_A$ clock transition of signal 249, on line 85, at the clock input of flip-flop 149, the $\overline{Q}$ output of flip-flop 149 goes to a binary zero, as illustrated by signal level 264 of signal 265 (FIG. 12). This binary zero on line 153 is seen as a binary one signal level by AND gate 155, which, upon the next occurrence of a $C_A$ clock transition, causes AND gate 155 to generate a binary one signal level on line 22. This binary one signal level is shown as pulse 266 of signal 267 (FIG. 12). This binary one signal is supplied back to the up/down binary counter 19 causing it to be reset to its mid-modulo count.

At the same time this is occurring, the Q output of flip-flop 137 is being supplied over line 147 to one input of NAND gate 157. The other input of NAND gate 157 is $C_A$ clock signal 249 on line 85. As a result of both signals to NAND gate 157 being a binary one, the output of NAND gate 157 on line 161 is a binary zero, as shown by the binary zero level 268 of signal 269 (FIG. 12). This binary zero is seen as a binary one at one input of AND gate 159. At this point it will be remembered that with two binary ones on line 87 and 89 respectively, the output of Exclusive OR gate 93, on line 96, is a binary zero which is seen as a binary one at the other input of AND gate 159. As a consequence, the output of AND gate 159 on line 163 is a binary one. This binary one is supplied to the display drive logic 27 as a shift control pulse.

The D-type flip-flop 137 is periodically reset over line 139 by an AND gate 141 in accordance to a negated $C_C$ clock signal on line 145 in combination with a $C_B$ clock signal on line 143. It can be seen from observing the $C_B$ clock signal 251 and the $C_C$ clock signal 253 (FIG. 12), that a reset signal is generated by AND gate 141, on line 139, two times for every occurrence of a $C_E$ clock pulse on clock signal 255.

Assuming now that the mode of operation is still fast-attack, slow-release, and that the signals on lines 87 and 89 are both binary zero, indicating that the count of up/down counter 19 is 3 or below. The output of NAND gate 91 on line 101 will be a binary one. The output of Exclusive OR gate 93, on line 96, will be a binary zero that is seen as a binary one by AND gate 151. The signal on line 89 to the display drive logic 27 will be a binary zero, indicating a shift right condition.

In response to the $C_E$ clock signal on line 103, the binary one at the $\overline{D}$ input of flip-flop 95 is clocked through causing the $\overline{Q}$ output of flip-flop 95 to be a binary zero on line 117. This binary zero does not reset flip-flop 113. As a result of the signal on line 117 being a binary zero at the occurrence of a $C_E$ clock pulse on line 103, the output of AND gate 121, on line 129, will be a binary zero. Since the signal on line 127 at this time, is also a binary zero the output of OR gate 131 on line 135 is a binary zero that does not clock flip-flop 137.

At the occurrence of a $C_J$ clock pulse on line 123, shown as clock signal 257 (FIG. 12), the binary one level on line 111 at the D input of flip-flop 113 is clocked to its Q output which is connected to one input of AND gate 125. This Q output is shown as signal 271 (FIG. 12). At the occurrence of this binary one transition on line 109 the $C_J$ clock signal on line 123 to the other input of AND gate 125 generates a binary one level on line 127, while the signal on line 129 is still a binary zero. The output of OR gate 131, as a result, will be a binary one on line 135. This level clocks the binary one level on line 133 of flip-flop 137 to its Q output on line 151, shown as pulse 275 of signal 273 (FIG. 12). Besides causing a reset pulse 277 of signal 281 (FIG. 12), the binary one output on line 147 is supplied to NAND gate 157, which, at the occurrence of the next $C_A$ clock on line 185 generates a zero pulse 282 of signal 283 on line 161 that is seen as a binary one at the input of AND gate 159. As a result of this input and the signal on line 96, the output of AND gate 159, on line 163, is a shift signal. This shift signal, in conjunciton with the direction signal on line 89, will cause a right shift.

Thus, as can be seen whenever an increase in the indication is required, as directed by the output of up-/down binary counter 119, the indication in the display is updated at a frequency defined by the $C_E$ clock signal 255 (FIG. 12). However, when a decrease in the indication of display 31 is required, as directed by up/down counter 19, the indication is updated at a frequency defined by the $C_J$ clock signal 257 (FIG. 12).

Assume now that the fast mode of operation for the display system is desired. The reset input of flip-flop 95 would be connected to an external signal source by way of line 99 that would hold the flip-flop 95 reset. In other words the $\overline{Q}$ output of flip-flop 95 would be a binary one level on line 117, regardless of the signal at its D input on line 101. This binary one level would maintain flip-flop 113 reset causing the Q output of flip-flop 113 on line 109 to be a binary zero. As a consequence, at the occurrence of a $C_E$ clock on line 103, AND gate 121 will pass a binary one level to OR gate 131 over line 129. At the same time, the signal on line 127 is a binary zero. Therefore, OR gate 131 will generate a binary one level on line 135 at the clocking input of D flip-flop 137. The D-type flip-flop 137 would be clocked in this manner as long as the D flip-flop 95 is held in its reset state.

As a consequence, the binary one signal level on line 147, at the occurrence of the $C_A$ clock pulse of clock signal 249 will cause NAND gate 157 to generate a zero on line 161 that enables AND gate 159. If the signals on line 87 and 89 are either both binary ones, indicating a count in counter 19 of 12 or above, or are binary zeros, indicating a count in counter 19 of 3 or below, the output of Exclusive OR gate 93 on line 96 is a binary zero which is seen as a binary one by AND gate 159. This signal is passed by AND gate 159, on line 163, to the display drive logic 27. The direction of shift signal on line 89, as was noted earlier, will cause the display to shift left or right, depending on whether the binary signal on line 89 is a binary one or a binary zero. From this description it can be seen that the display indication is updated in both the up direction and the down direction at the occurrence of each $C_E$ clock pulse as illustrated by clock signal 255 (FIG. 12).

If it is desired that the display system be operated in the slow mode, the set input of D flip-flop 95 will be connected to an external signal source by way of line 97, that will hold the D flip-flop 95 set. In other words the $\overline{Q}$ output of flip-flop 95, on line 117, will be a binary zero. As a consequence, the D-type flip-flop 113 will not be reset. The output of AND gate 121, at the occurrence of a $C_E$ clock on line 103, to OR gate 131 on line 129, will be a binary zero. However, at the occurrence of a $C_J$ clock pulse on line 123, the binary one voltage level on line 111 will be clocked to the Q output, on line 109, of flip-flop 113. At AND gate 125, it is clocked through to OR gate 131, over line 127. The output of OR gate 131, at this time, on line 135, to flip-flop 137, will be a binary one. This binary one level clocks the D flip-flop 137 to generate a binary one level on the Q output of the flip-flop, on line 151. As previously described, this signal enables AND gate 159 and causes AND gate 155 to generate a reset signal.

If the output of Exclusive OR gate 93, on line 96, as a consequence of the signals on lines 87 and 89 being a combination of binary one and binary zero levels, is a binary one, AND gate 159 will not generate a shift signal. It should be remembered that this combination of binary signals on lines 87 and 89 from the up/down counter indicates that the count is between 4 and 11. However, if the signals on lines 87 and 89 are either both binary one or both binary zero, indicating that the count is above 12 or below 3 respectively, the output of Exclusive OR gate 93 on line 96 will then be a binary zero, which is seen as a binary one by AND gate 159. This causes it to generate a shift signal on line 163. The direction of shift as above noted will be dictated by the binary signal level on line 89.

Figures 5, 6:
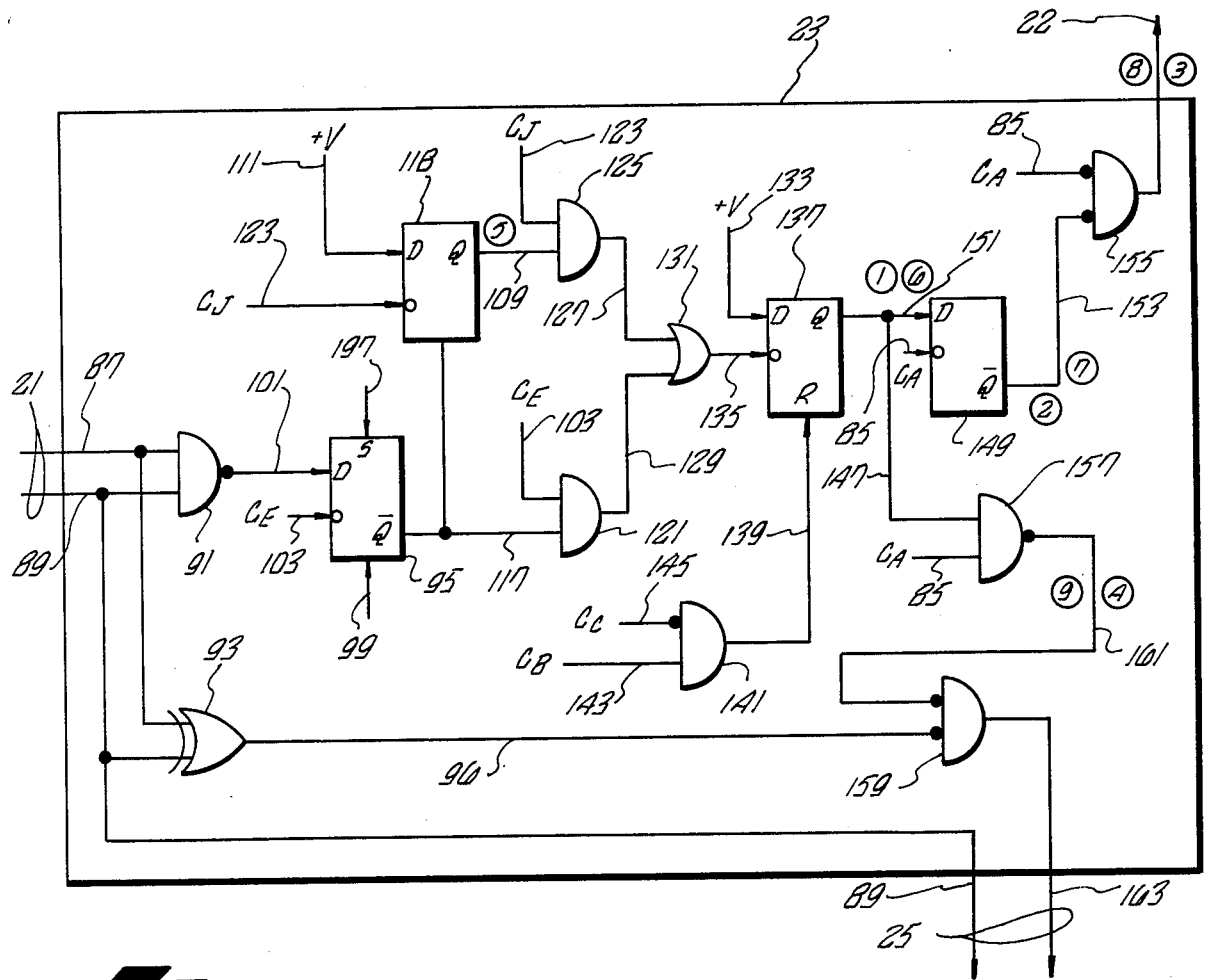
FIG. 5 is a logic diagram of the display update and mode selection circuit of FIG. 1.
FIG. 6 is a logic diagram of the display drive circuit of FIG. 1.

The display drive logic 27 that receives the shift signals, on line 163, and the shift direction signals, on line 89, from the display update and mode selection logic 23, by way of cable 25, is more specifically illustrated in FIG. 6. Basically the display drive logic consists of a multiple stage, serial/parallel shift register 173 that receives a voltage level at its serial input 170 and supplies the signal stored within each stage over a plurality of parallel lines 29 that equal the number of lights used in the display mechanism 31, minus 2.

For purposes of example, the display mechanism is shown as having seven lights. Thereby, the shift register 173 is a five-stage shift register having output lines 175, 177, 179, 181 and 183. The shift register 173 shifts right or left depending upon the command signals on lines 163 and 89 from the display update and mode selection logic 23. The signal output on line 175 is for the least significant, active light indication, whereas the signal on line 183 is for the most significant, active light indication. A voltage level on line 170 is shifted into the least significant stage, or the rightmost stage of the shift register 173.

The binary output signals on lines 175 through 183 of the shift register 173 will depend upon the control signals received over cable 25 and the position of switch 169. If switch 169 is in position 1, a positive voltage source connected to line 171 will be connected to the input 170 of the serial/parallel shift register 173. As a result, each subsequent shift of the shift register causes each subsequent stage to generate a binary one level. The number of stages generating binary ones increases by one upon each subsequent left, or up-shift. The number of generating binary ones decreases upon each subsequent right or down-shift. This will cause a light indication in the display device 31, as will be more fully explained hereinafter, of the type known as a "thermometer" indication.

Figure 7:
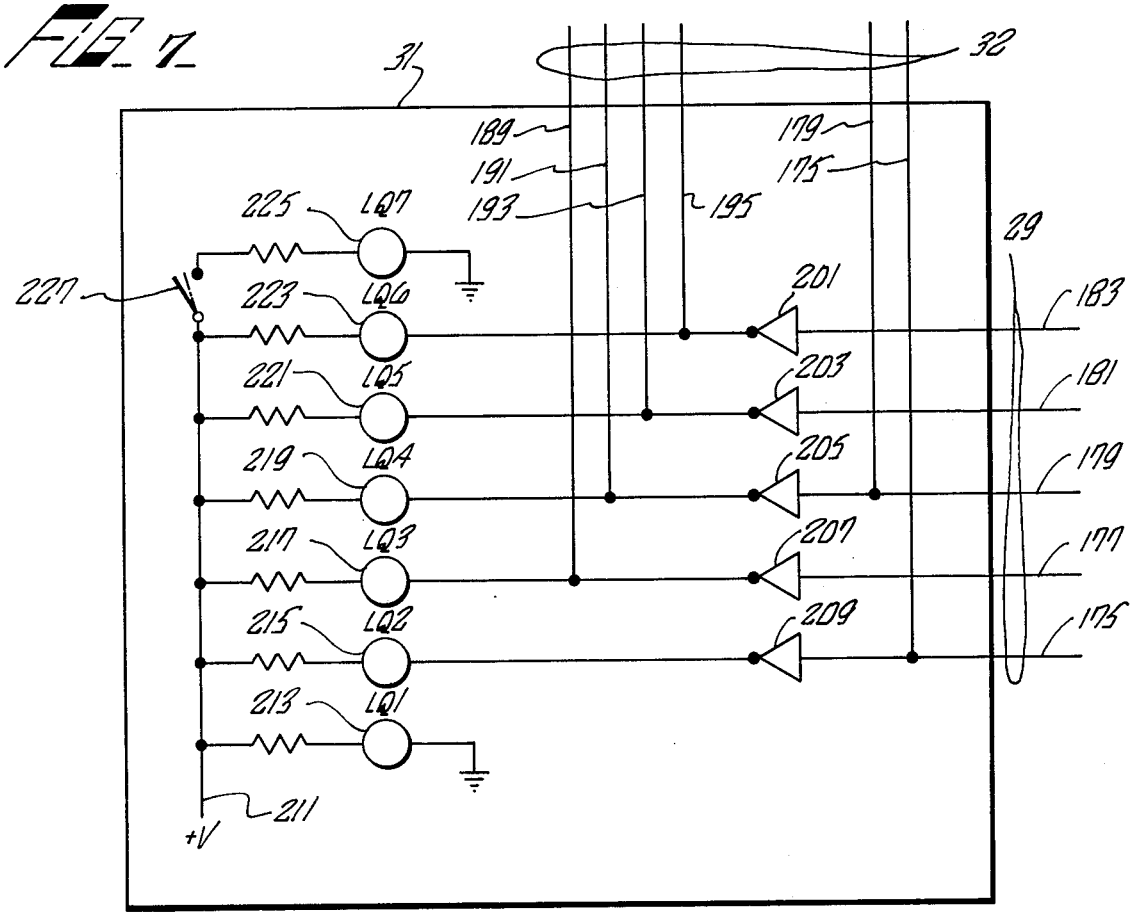
FIG. 7 is a logic and circuit diagram of an embodiment of the display of FIG. 1.

If the switch 169 is located in position 2, the output of NOR gate 167 is connected to the input 170 of the register 173. A binary one level will be loaded into the least significant position of register 173 only once. That is, when the signal on line 33 and the signal on line 185, the two inputs to NOR gate 167 are both binary zero, the output of NOR gate 167 will be a binary one level. The signal on line 185 will be a binary zero only when the first stage, that is the least significant stage of the shift register 173, is empty. The signal on line 33 will be a binary zero only when none of the lights are lit or only the first least significant light in the display 31 is lit. When switch 169 is in the number 2 position, the output of the shift register 173 on its output lines 175 through 185 causes the shifting of a single binary signal level from right to left and left to right causing the display 31 to provide what is commonly known as a "bouncing ball" indication. This bouncing ball indication, as will be more fully explained hereinafter, in connection with FIG. 7 utilizes an upper and lower bound. When the switch 169 is in the number 2 position, the switch 227 in the display device (FIG. 7) will be closed. When switch 169 is in the number 1 position, the switch 227 will be open, as shown (FIG. 7).

The parallel output lines in cable 29 of the shift register 173 are supplied to the display device 31 which consists of a serial array of what may be light emitting diodes, LQ1 through LQ7 seen as lights 213, 215, 217, 219, 221, 223 and 225 respectively. Whenever the display mechanism is active, LQ1 light 213 is on receiving power from a positive voltage source at line 211 and being connected to ground. The uppermost or highest indicating LQ7 light 225 will be on or off depending upon the type of indication selected by the position of switch 169 (FIG. 6). If the bouncing ball type of indication is chosen, switch 227 will be closed, causing light 225 to also be continuously on. Lights 213 and 225 being on in a bouncing ball type of indication define an upper and lower limit for the movement of the ball between the two. If a thermometer type of indication is chosen by placing switch 169 in the number 1 position, switch 227 will be open, thereby removing LQ7 light 225 from the circuit.

Assume that the indication is to be a thermometer type. Switch 169 must be set in the number 1 position. Assume also that the output of the register 173 (FIG. 6) is a binary one on line 175 from its first stage. This binary one level is inverted by inverter 209 placing a zero or ground level on one side of LQ2 light 215 causing it to turn on. Since the signal levels on lines 177, 179, 181, and 183 are binary zeros, the outputs of the respective inverters 207, 205, 203 and 201 will be binary ones which prevent current flow through LQ3 to LQ6 leaving these lights off. If the display indication, that is, light LQ1 and light LQ2 being on, is not an accurate indication of the signal being received by the display system on line 11 (FIG. 1) in that the signal being received is of much greater magnitude, the display update and mode selection logic 23 (FIG. 1) will cause the display drive logic 27 to shift left at a repetition rate selected by the mode selection logic. The display drive logic 27, in response thereto, will cause the shifting of a binary one into its second stage at the same time that another binary one level is shifted into its first stage. This causes a binary one level to be placed on line 177 which causes LQ3 light 217 to go on. Because another binary one level was shifted into the first stage, the signal on line 175 remains at a binary one level maintaining LQ2 light 215 on. This may continue, thereby causing the lights LQ2, LQ3, LQ4, to go on sequentially and remain on. This action simulates the rising of a mercury column in a thermometer. The reverse will occur if the light indication is greater than the signal level being received on line 11 (FIG. 1). The maximum indication in this mode would be the lighting of LQ6 light 223. It should be remembered that in this mode LQ7 light 225 is not in the circuit.

If the bouncing ball type of indication is chosen the switch 169 must be placed in the number 2 position. The switch 227 will close in response thereto, thereby causing LQ7 light 225 to be continuously on with LQ1 light 213. In this type of indication, the lowest indication possible is generated by placing a binary one signal on line 175 which causes LQ2 light 215 to go on. Assuming that an increased indication is commanded by the display update mode selection logic 23, the output of the shift register 173 would be a binary zero on line 175 and a binary one on line 177 thereby extinguishing LQ2 light 215 and igniting LQ3 light 217. A continual increase in the indication will cause LQ4 light 219 to turn on and LQ3 light 217 to turn off, and so on. In the decreasing direction, the higher light such as LQ4 light 219 will turn off and LQ3 light 217 will turn on, in a sequential manner. This action simulates a ball bouncing between an upper and lower boundary.

The display has been shown as being driven directly by the output signals from the serial/parallel shift register. This need not be the case, however, and the invention should not be considered as so limited. For example, a read-only memory (not shown) may be used in place of the decoder 35, if non-linear indications are desired. The contents of the memory would define the non-linear weighting function.

The light indication also should not be construed as limited to a configuration that is only susceptible of being driven by binary signal levels. The signals from register 173 could be utilized to turn on transistor switches (not shown), for example, that would connect an analog voltage source (not shown) to the various lights to power them.

Figure 8:
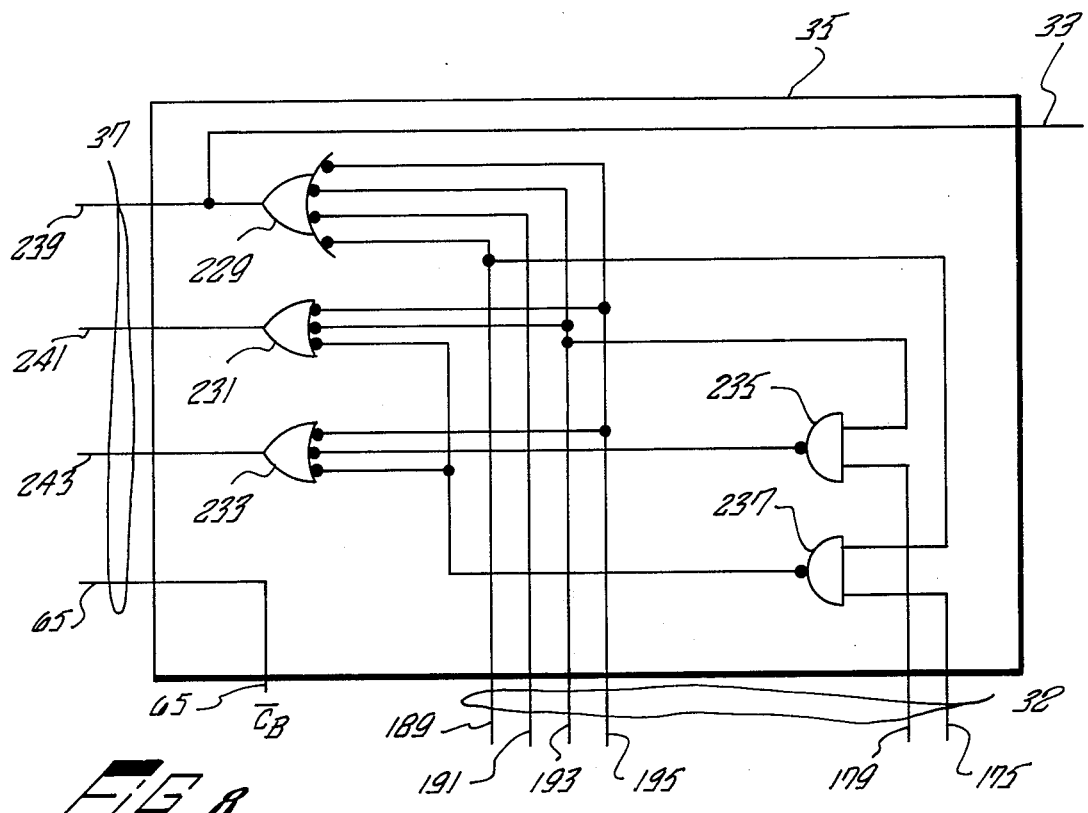
FIG. 8 is a logic diagram of an embodiment of the display decoder of FIG. 1.

The indication presented by display 31 is continually monitored by a plurality of lines 175, 179, 195, 193, 191 and 189, in cable 32, which lead to the display decode and threshold generator 35 of FIG. 8. This decoding logic consists of a plurality of multiple input OR gates 229, 231 and 233, and a pair of NAND gates 235 and 237. They are connected to provide a binary word indication on the parallel lines 239, 241, and 243 in cable 37 that indicates the specific combination of lights that are lit in the display mechanism 31. Line 239 presents the first most significant bit of that binary word. This information is supplied to a digital-to-analog converter 39 (FIG. 10).

Referring to FIG. 9 at this time, it can be seen that the second, third and fourth columns indicate the three-bit binary word output on cable 37 of the decoder 35 that correspond to a specific light or combination of lights being on as indicated in column 1. Thus, for example, if LQ2 light 215 is on, the signal on line 239 will be a binary zero, the signal on line 241 will be a binary one, and the signal on line 243 will be a binary one. If LQ3 light 217 were turned on by a drive logic 27, whether or not LQ2 light 215 were turned on or off, the signal on line 239 would be a binary one, and the signals on lines 241 and 243 would both become binary zeros. The same situation exists for the remaining lights LQ4 through LQ6 as shown in the table of FIG. 9.

The digital-to-analog converter 39 of FIG. 10 receives the signals in cable 37 as the first three most significant bits of an eight bit word. The remaining five bits of that word are supplied by the $\overline{C_B}$ clock signal on line 65. The type of digital-to-analog converter utilized is well known in the art and can be procured from integrated circuit chip manufacturers. Referring again to FIG. 9, it can be seen that if only the LQ2 light in the display is on, two eight bit words are supplied to the digital-to-analog converter 39, one representing an upper threshold and the other representing a lower threshold. The upper threshold is defined by the five least significant bits all being binary one, i.e. when $\overline{C_B}$ clock on line 143 is one. This generates an eight bit binary word that is converted into a voltage level of a certain magnitude, as illustrated by the decimal equivalent "127" of that word. When the clock on line 143 is zero, a different eight bit binary word is received by the digital-to-analog converter 39, because the five least significant digits of that word are now a binary zero. This is illustrated by the decimal equivalent "96" for that eight bit binary word. This occurs for the remaining lights LQ3 though LQ6 in a similar manner. The output of the digital-to-analog converter 39, thereby, is a high and low threshold for each possible indication in the display mechanism 31. This analog voltage is supplied on line 41 to the analog comparator 15 where it is compared in amplitude to the incoming signal on line 11 (FIG. 1).

Figure 13:
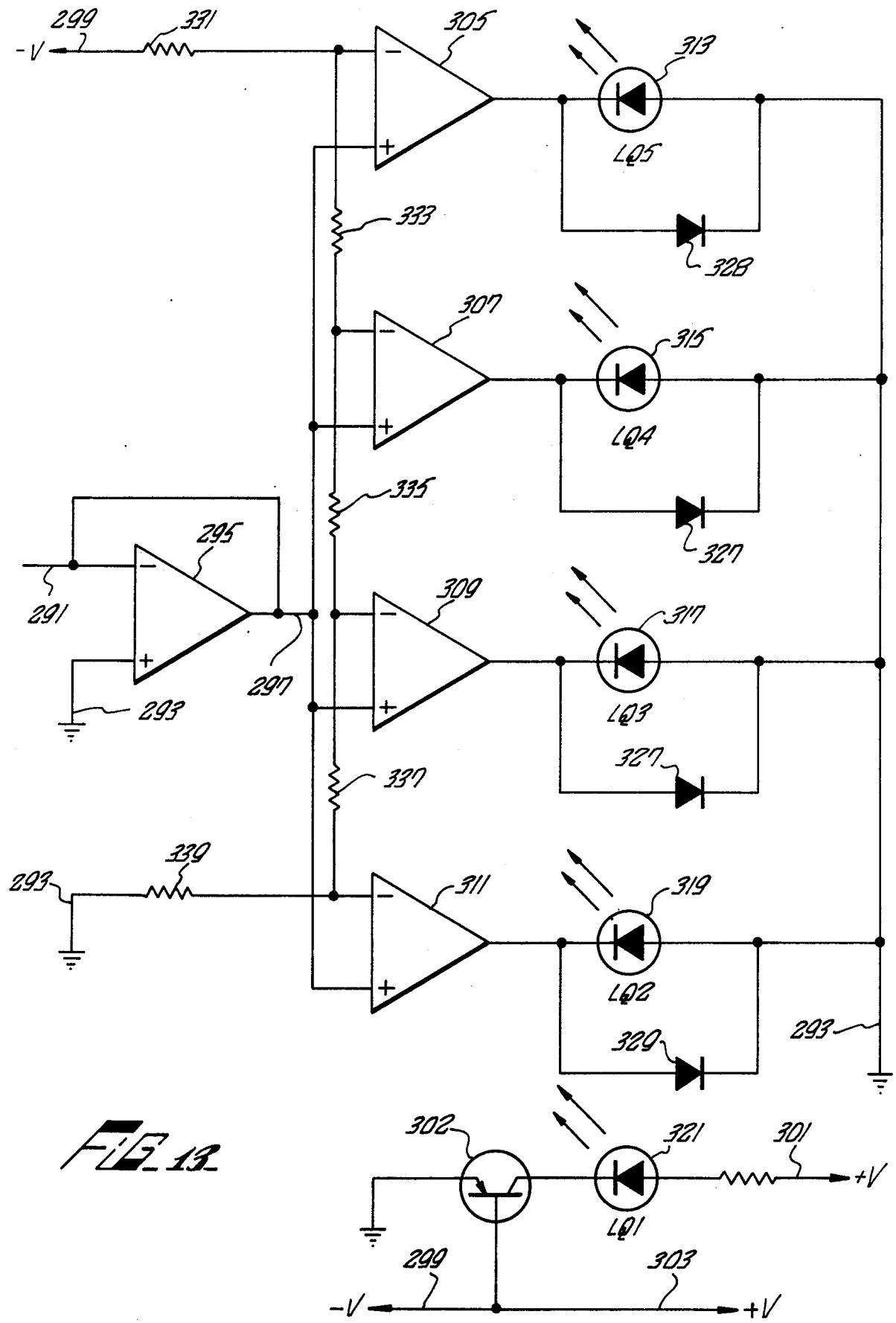
FIG. 13 is a circuit diagram of an alternate preferred embodiment of a signal display system according to the present invention.

An alternate preferred embodiment of the present invention that may be utilized when only a thermometer type of indication is desired is illustrated in FIG. 13. The circuit of FIG. 13 is a considerably simplified embodiment as compared to the first embodiment, in that the elements used therein are all analog elements, such as operational amplifiers light-emitting diodes, and resistors. It should be realized however, that the flexibility of the circuit of FIG. 13 is considerably limited as compared to the flexibility of the above illustrated and described first embodiment. The circuit of FIG. 13 can only provide a thermometer type indication thus, it does not have the capability of selectively changing the type of indication rendered. The circuit of FIG. 13 can only operate in a single response mode.

The display circuit of this alternate embodiment receives a signal to be displayed on line 291. An operational amplifier 295 simultaneously supplies this signal on line 297 to a plurality of operational amplifiers 305, 307, 309, and 311. Each operational amplifier causes its respective light-emitting diode 313, 315, 317, and 319 to turn on, depending on the magnitude of the signal received on line 297.

A first LQ1 light-emitting diode 321 is on continually from the moment that power is applied to the display system over lines 299, 303 and 301. The voltages applied to lines 299 and 303 turn on a transistor 302. This permits a current flow from a positive voltage source (not shown) connected to line 301 through LQ1 light-emitting diode 321, through transistor 302 to ground.

The negative voltage source (not shown) connected to line 299 is connected to one side of a first resistor 331 which in turn is connected to a series resistance chain 333, 335, 337, and 339 to ground on line 293, thereby causing a current flow through these series resistors from the negative voltage source on line 299 to ground on line 293. As a result of the resistors in the circuit, the inverting inputs of the respective differential amplifiers 305, 307, 309, and 311 will have a certain fixed voltage applied thereto. This fixed voltage level at the inverting input of each of the respective operational amplifiers 305 through 311 defines, as will be more fully explained hereinafter, the threshold or boundary which when exceeded by the voltage received at the non-inverting input, will cause the light-emitting diode responsive to that operational amplifier to turn on. When the voltage at the non-inverting input does not exceed this boundary voltage, the respective light-emitting diode remains turned off.

The circuit of FIG. 13 generally operates as follows. Upon power being applied, the LQ1 first light-emitting diode 321 turns on and stays on as long as the indicating circuit has power applied thereto. Assume a signal is being received on line 291 which is to be displayed. Generally the magnitude of the received signal is to be displayed by the light-emitting display made up of light-emitting diodes 313, 315, 317, and 319 and 321. The signal is supplied by way of amplifier 295 to line 297. Amplifier 295 simply acts as an inverting amplifier which provides the negative of the received magnitude signal on line 291 to line 297. This signal is then supplied simultaneously to the positive or non-inverting input of the operational amplifiers 305, 307, 309, and 311. As already mentioned, the other input or inverting input of such operational amplifiers define the threshold for that particular operational amplifier to activate its respective light-emitting diode. The output of each of the operational amplifiers 305, 307, 309, and 311 will either be zero or a negative voltage depending upon the magnitude of the input signal at the non-inverting input of the respective operational amplifiers.

Assume that the signal on line 297 is a magnitude that only exceeds the threshold voltage magnitude applied to the inverting input of operational amplifier 311. As a result, the output of operational amplifier 311 is effectively a negative voltage thereby causing a current flow from ground at line 293 to operational amplifier 311. This current flow causes LQ2 light-emitting diode 319 to turn on. The diode 329 shunting the LQ2 diode 319 insures that in case the output of operational amplifier 311 happens to go positive sufficiently to cause current flow in the circuit towards ground, the light-emitting diode 319 will not be damaged thereby since the diode 329 would shunt such current flow around it.

If the magnitude of the signal being received on line 297 continues to increase and exceeds the voltage threshold being applied to the inverse input of operational amplifier 309, the output of operational amplifier 309 will effectively go to a negative voltage value. It should be remembered that the output of operational amplifier 311 remains at its effective negative voltage value as long as the voltage input at its positive input terminal exceeds the voltage input at its inverse input terminal. As a result of the output of operational amplifier 309 going to a negative voltage, the LQ3 light-emitting diode 317 turns on.

Assuming that the magnitude of the signal on line 297 increases again, operational amplifier 307 will cause LQ4 light-emitting diode 315 to turn on. If it increases even further, operational amplifier 305 will likewise cause LQ5 light-emitting diode 313 to turn on. Light-emitting diode 313 is the maximum indication. No further light-emitting diodes are turned on if the magnitude of the input signal on line 297 becomes any larger.

In a similar seriatim fashion, when the signal on line 297 decreases, the first operational amplifier to respond would be the one driving the maximum indicating light-emitting diode 313, causing it to turn off when the voltage level, at its non-inverting input fell below the voltage level at its inverting input. Similarly operational amplifier 307 would turn off its respective light-emitting diode 315 and operational amplifier 309 would turn off its respective light-emitting diode 317. As can be seen, the indication generated by LQ1 to LQ5 light-emitting diodes simulate a thermometer indication.

It can be seen from the above description of the embodiments that the invention provides a signal display system that has a fast response time and long-range readability combined with a quantitative indication. The entire display may be manufactured by solid state components that require a minimum of adjustment and maintenance. The display system provides for varying degrees of sensitivity and selectivity between two different types of displays and between three different response modes.

Obviously many modifications and variations of the present invention are possible in light of the above teachings. It is therefore to be understood that within the scope of the appended claims the invention may be practiced otherwise than as specifically described.

What is claimed is:

1. A continuous, quantitative analog-signal-display system, using a serial string of light-emitting elements, said system comprising:
   means for generating an analog signal representative of the illuminated elements;
   means for continuously comparing the analog signal from said generating means with the analog signal to be displayed; and
   means for changing the illumination of said light-emitting elements in response to the output from said comparing means.

2. The signal display system of claim 1, further comprising means for selectively changing the format of illumination of said light-emitting elements from a thermometer type to a bouncing-ball type display.

3. The signal display system of claim 1 wherein said analog signal generating means includes means for generating a binary signal representative of the illuminated elements.

4. The signal display system of claim 5 wherein said binary signal generating means, includes means for providing an upper and lower threshold for each binary indication from said binary signal generating means.

5. The signal display system of claim 1 wherein said comparing means, comprises: means for comparing the voltage levels of the two input signals and generating a first binary output if the first signal is higher than the second and a second binary output if said second signal is higher than said first signal.

6. The signal display system of claim 5 wherein said comparing means further comprises: means, receiving the binary output of said voltage level comparing means, for counting the number of times the first binary output and the second binary output occur.

7. The signal display device of claim 1 wherein said changing means, includes means for sampling the output of said comparing means.

8. The signal display device of claim 7, further comprising means for altering the sampling rate of said sampling means.

9. The signal display device of claim 1 wherein said format changing means includes a multi-stage shift register.

10. The signal display device of claim 9 wherein said format changing means, further comprises means for alternatively causing only one stage of said shift register to be set at one time, or causing the stages of said shift register to be set sequentially.

11. A continuous, quantitative analog signal display system, comprising:
    a plurality of light-emitting elements caused to be actuated by binary signal levels;
    means responsive to the binary signal levels causing illumination of said light-emitting elements for generating a binary word representing the light-emitting elements actuated;
    means for converting the binary word into an analog signal;
    means for continuously comparing the analog signal from said converting means with the analog signal to be displayed; and
    means for changing the illumination of said light-emitting elements in response to the output from said comparing means.

12. The signal display system of claim 11 wherein said binary word generating means generates two binary words for each respective set of light-emitting elements illuminated, one word representing an upper limit, the other word representing a lower limit.

13. The signal display system of claim 11 wherein said illumination changing means, comprises means for averaging the indications from said comparing means.

14. The signal display system of claim 11 wherein said comparing means detects differences between signal amplitudes and generates a first binary level for a first difference and a second binary level for a second difference.

15. The signal display system of claim 14 wherein said illumination changing means, comprises means for counting the first binary levels and the second binary levels generated by said comparing means.

16. The signal display system of claim 11 wherein said illumination changing means, comprises means for sampling the output of said comparing means.

17. The signal display system of claim 16 wherein said illumination changing means, further comprises means for altering the rate at which the output of said comparing means is sampled.

18. The signal display system of claim 17 wherein said illumination changing means, further comprises a multi-stage shift register connected to the output of said sampling means, the output of said register supplying binary signal levels for illumination of said light-emitting elements.

19. The signal display system of claim 18 wherein said illumination changing means, further comprises means for causing said shift register to either only have one stage actively driven at one time, or to have its stages sequentially activated.

20. The signal display system of claim 11, further comprising means for selectively altering the format of illumination of said light-emitting elements from a thermometer type to a bouncing-ball type display.

21. A continuous, quantitative signal display system, using a serial string of light-emitting elements, said system, comprising:
means for establishing a unique reference signal level for each light-emitting element in the signal display, said unique reference level representing a quantity of the signal to be displayed;
means for continuously comparing the signal to be displayed with each said unique reference signal level; and
means for illuminating the light-emitting elements corresponding to the reference signal levels exceeded by the signal to be displayed.

22. The signal display system of claim 21 wherein said means for establishing a unique reference signal level for each light-emitting element comprises a voltage source connected to a serial string of resistors.

23. The signal display system of claim 22 wherein said means for continuously comparing comprises a plurality of differential amplifiers, each amplifier having its output connected to a different light-emitting element, one input connected to the serial string of resistors, and the other input connected to the source of the signal to be displayed.

24. The signal-display device of claim 5, further comprising means for sampling the first and second binary outputs of said comparing means.

25. The signal-display device of claim 24 further comprising means for altering the sampling rate of said sampling means.

26. The signal-display device of claim 24 further comprising means for sampling the first binary output of said comparing means at a rate different from the sampling rate of the second binary output of said comparing means.

* * * * *

UNITED STATES PATENT AND TRADEMARK OFFICE
CERTIFICATE OF CORRECTION

PATENT NO. : 4,083,042
DATED : April 4, 1978
INVENTOR(S) : George Raymond Kushin, Ming-Luh Kao It is certified that error appears in the above-identified patent and that said Letters Patent are hereby corrected as shown below:

Column 2, line 57, after "signal" insert -- quality of a --.

Column 3, line 2, delete "element" and insert -- elements --.

Column 3, line 44, delete "35" and insert -- 25 --.

Signed and Sealed this

Twenty-sixth Day of September 1978

[SEAL]

Attest:

RUTH C. MASON
Attesting Officer

DONALD W. BANNER
Commissioner of Patents and Trademarks